United States Patent

Suzuki et al.

[11] Patent Number: 6,043,145
[45] Date of Patent: Mar. 28, 2000

[54] METHOD FOR MAKING MULTILAYER WIRING STRUCTURE

[75] Inventors: Toshiharu Suzuki; Keiichi Maeda; Kazuhide Koyama; Tatsuji Oda, all of Kanagawa, Japan

[73] Assignee: Sony Corporation, Tokyo, Japan

[21] Appl. No.: 08/813,350

[22] Filed: Mar. 7, 1997

[30] Foreign Application Priority Data

Mar. 13, 1996 [JP] Japan .................................. 8-055690
Apr. 11, 1996 [JP] Japan .................................. 8-089083

[51] Int. Cl.[7] .............................................. H01L 21/4763
[52] U.S. Cl. ......................... 438/622; 438/624; 438/634; 438/637; 438/638; 438/666; 438/667
[58] Field of Search .................................. 438/622, 624, 438/634, 637, 638, 666, 667

[56] References Cited

U.S. PATENT DOCUMENTS 5,126,006  6/1992  Cronin et al. .......................... 156/643
5,354,711  10/1994  Heitzmann et al. .................... 438/638
5,741,626  4/1998  Jain et al. .............................. 438/638
5,858,877  1/1999  Dennison et al. ...................... 438/700

*Primary Examiner*—John F. Niebling
*Assistant Examiner*—Lynne A. Gurley
*Attorney, Agent, or Firm*—Ronald P. Kananen; Rader, Fishman & Grauer PLLC

[57] ABSTRACT

In a method for making a multilayer wiring structure, a second insulating film having an etching rate slower than a first insulating film is provided on the first insulating film covering a wiring pattern; an opening is formed in the second insulating film in a portion corresponding to a connecting hole to be formed afterwards; a third insulating film having an etching rate faster than the second insulating film is provided on the opening and the second insulating film; a groove is formed, so as to expose the opening, in the third insulating film in a portion where an upper-layer wiring pattern is formed, and the connecting hole reaching the wiring pattern is formed; and a connecting plug is formed by packing a conductive material in the connecting hole, and the upper-layer wiring pattern is formed by packing a conductive material in the groove.

16 Claims, 10 Drawing Sheets

METHOD FOR MAKING MULTILAYER WIRING STRUCTURE

BACKGROUND OF THE INVENTION

1. Field of the Invention

The present invention relates to a method for making a multilayer wiring structure of a semiconductor integrated circuit.

2. Description of the Related Arts

Recently, the levels of integration in semiconductor integrated circuits are increasingly being raised. In accordance with this, devices formed on semiconductor substrates, such as active devices, are practically manufactured in increasingly finer sizes.

Meanwhile, although the performance of these devices is being improved along with improvements in fineness, wiring patterns interconnecting such devices cannot be narrowed in response to such improvements due to limitation such as those relating to electric current density. In one method to overcome this problem, devices are interconnected by employing a multilayer wiring structure. In a multilayer wiring structure, especially for an integrated circuit for a special use, such as a gate array type circuit, the number of the wiring layers reaches as many as 5, 6, or more. Accordingly, the number of connections between each device and each wiring pattern, or between wiring layers lying one upon another, is enormous.

In addition to narrowing the widths of the wiring patterns, the heights of the wiring patterns should also be lowered to reduce the capacitance between wiring patterns in the same wiring layer since LSI's are required to have low power demands and high performances. To meet this, wiring materials which have low electrical resistances and high electromigration resistances, i.e. high allowable current densities, have been investigated. A typical example of such a material is copper. Since copper is poor in processability, a buried wiring structure obtained by employing a chemical mechanical polishing technique (CMP) has been proposed to improve current density by using copper.

FIG. 1 contains drawings illustrating a method for forming a multilayer wiring structure and achieving connections between wiring layers (via hole connections) according to the related art, which can achieve manufacture of semiconductor integrated circuits of the so called 0.25 μm generation.

Initially, as shown in FIG. 1A, an insulation film 2 is formed on a substrate 1 on which active devices (not illustrated) have been formed, and a plurality of first wiring patterns 3 are then formed on the insulation film 2.

Next, as shown in FIG. 1B, an interlayer insulation film 4 is formed on the above-mentioned insulation film 2 so as to cover the above-mentioned first wiring patterns 3 by a technique of, for example, Ozone-TEOS-CVD or Plasma-enhanced TEOS-CVD (here, TEOS is the abbreviation of "tetraethoxysilane", and CVD is the abbreviation of "chemical vapor deposition"). This interlayer insulating film 4 insulates the first wiring patterns 3 and second wiring patterns to be formed afterwards. Ordinarily, a TEOS-CVD technique, in which a highly fluid material is used, is preferably employed to form the above-mentioned interlayer insulating film 4 since it is suitable to fill up the spaces between the first wiring patterns. Alternatively, an ECR-CVD technique or SOG technique are also employed (here, ECR is the abbreviation of "electron cyclotron resonance", and SOG is the abbreviation of "spin on glass").

Subsequently, a resist pattern (not illustrated) which has an openings only in a portion for connection between a first wiring pattern 3 and a second wiring pattern to be formed afterwards is formed by an ordinary photolithography technique. While using this resist pattern as an etching mask, a connecting hole 5 having a diameter of approximately 0.35 μm is then formed in the interlayer insulating film 4 by reactive ion etching, and the resist pattern is removed.

After this, as shown in FIG. 1C, an adhering layer 6 is provided by sputtering, and further, as shown in FIG. 1D, an aluminum-based metal layer 7 is provided by sputtering to pack connecting metal and to form the second wiring pattern.

Here, in an integrated circuit which is highly finely manufactured and which has a high integration level, the aspect ratio of the connecting hole 5 is generally as high as approximately 2, and therefore, it is required to heat the aluminum-based metal up to 500° C. or more and to pour such fluidized metal into the connecting hole 5 in order to sufficiently fill the connecting hole 5 with metal and secure conduction.

Next, the above-obtained aluminum-based metal layer 7 is subjected to patterning by an ordinary photolithography technique and an etching technique to obtain a desired wiring pattern containing the connecting portion.

Several methods can be employed for pouring the above-mentioned aluminum-based metal into the connecting hole. For example, a substrate 1 may be heated up to approximately 500° C. on sputtering, and the pouring of metal into a connecting hole 5 is performed at the same time as an aluminum-based metal layer 7 is being formed. Alternatively, after a connecting hole 5 is formed, an aluminum-based metal layer 7 may be provided by sputtering in a highly vacuum atmosphere so as not to fill up the connecting hole 5, and the aluminum-based metal layer 7 is then pressed in a high pressure vessel at approximately 500° C. and 20 MPa to force the metal into the connecting hole 5.

Further, tungsten (W) can be used in addition to an aluminum-based metal as a metal for filling a connecting hole and securing conduction. When tungsten is used in, for example, a LSI of the 0.25 μm generation, even a connecting hole having a high aspect ratio such as of approximately 0.35 μm in diameter and approximately 0.6 μm in depth can be filled by a CVD technique in which surface reaction is the principal mechanism. In this case, tungsten is initially deposited over the entire surface of a substrate in which a connecting hole is formed, and tungsten in the plain portion only is removed by reactive ion etching to form a tungsten plug in the connecting hole. Next, by an ordinary deposition technique such as sputtering, aluminum-based metal is deposited and further subjected to patterning to obtain a second wiring pattern.

Any methods described above require providing a barrier metal or an adhering layer by sputtering or CVD before the connecting hole is filled with metal. In a case where the connecting hole is filled with an aluminum-based metal, the fluidity of the metal is reduced due to oxidation of aluminum when the metal comes into contact with an interlayer insulation film which contains an oxide compound. To avoid this, it is necessary to provide a barrier metal which comprises a thin film of titanium nitride (TiN). Meanwhile, adhesion of tungsten is low at the surface of an interlayer insulation film where an oxide thin film or the like is exposed, or at the side wall of the connecting hole. Accordingly, when tungsten is used, it is necessary to provide an adhering layer which comprises a thin film of titanium nitride in order to prevent peeling.

Moreover, adding copper to aluminum has been proposed as a method for improving the electro-migration resistance of an aluminum-based wiring pattern, and methods for increasing the content of copper have been offered. For example, a technique using aluminum-based metal which principally comprises aluminum and contains approximately 0.5% of copper having a mass greater than the aluminum is already known. Since scattering of aluminum by electrons occurs most intensively at aluminum grain boundaries, properly dispersing copper at the boundaries can reduce such scattering and brings about an inhibitory effect against breakage due to electro-migration.

Hereinafter, a typical example of an aluminum-based wiring structure which can achieve LSI's of the 0.25 µm generation.

In LSI's of the 0.25 µm generation, the wiring pattern 11 is approximately 0.6 µm in height and approximately 0.35 µm in width, and requires being resistant to a current density of $1 \times 10^5$ A/cm$^2$.

Further, in LSI's of the 0.18 µm generation, although the spaces between wiring patterns are reduced, thinning the wiring patterns to reduce capacitance between wiring patterns in a wiring layer constructed by wiring is needed in accordance with requirements of low power demands and high speed for LSI's.

To meet these demands, the cross-sectional areas of wiring patterns should further be reduced to improve electro-migration resistance, or a material having excellent electro-migration resistance should be selected and the electrical resistances of wiring patterns should be reduced.

In contrast to the method using an aluminum-based wiring material of the related art described above, there is a method using, as a wiring material, copper which has excellent resistivity and excellent electro-migration resistance.

In such a method, ordinary reactive ion etching can rarely be employed for forming a wiring pattern since a compound having a high vapor pressure can rarely be derived from copper. As a remedy for this, a buried wiring structure obtained by employing a CMP technique has been proposed. As to the buried wiring structure, a structure has been previously proposed in which a connecting plug from a lower layer is initially formed and only a wiring portion is then buried with copper or the like. In another proposal, the connection between wiring layers is also achieved with copper. Hereinafter, a so called Dual Damascene method is explained with reference to FIG. 2.

As shown in FIG. 2A, an insulating film 12 is provided on a semiconductor substrate 11, and further, a first wiring pattern 13 is formed on the insulating film 12.

Initially, on such a semiconductor substrate 11, a so-called Gap Fill insulating film and an insulating film to inhibit the generation of capacitance between wiring layers are deposited by a depositing technique such as a TEOS-type CVD method. After this, an interlayer insulating film 14 having a smooth surface is formed by a smoothing technique such as CMP. Next, an etching-termination insulating film 15 is provided on the above-mentioned interlayer insulating film 14 by a CVD method, and then an inter-wiring insulating film 16 is further provided.

Hereupon, the interlayer insulating film 14 is formed so as to have a thickness of, for example, approximately 0.6 µm, with which the inter-wiring-layer capacitance in the first wiring pattern 13 does not matter.

Next, as shown in FIG. 2B, a resist film 17 is provided on the above-mentioned inter-wiring insulating film 16 by an ordinary coating technique, and openings 18 are formed by a lithography technique in the resist film 17 at portions where wiring is to be done. Grooves 19 of approximately 0.6 µm in depth, which corresponds to the desired heights of wiring patterns to be formed, are then formed in the inter-wiring insulating film 16 by etching using this resist film 17 as an etching mask. The reaction in this etching is stopped by the etching-termination insulating film 15.

Subsequently, as shown in FIG. 2C, after the above-mentioned resist film is removed, a resist film 20 is provided again by coating, and an opening 21 is formed by a photo-lithography technique in a portion for connecting with the first wiring pattern 13. While using this resist film 20 as an etching mask, a connecting hole 22 is then formed by etching the etching-termination insulating film 15 and the interlayer insulating film 14 until the first wiring pattern 13 is exposed. After this, the resist film 20 is removed.

Next, as shown in FIG. 2D, copper 23 for a wiring pattern is deposited by a CVD method so as to have a thickness thicker than the thickness from the interlayer insulating film 14 to the inter-wiring insulating film 16, for example, 1.5 µm.

After this, copper 23 in the portions other than the inside of the grooves 19 and the inside of the connecting hole 22 is removed by polishing using a CMP technique in conditions suitable for metal polishing. As a result, as shown in FIG. 2E, a connecting plug 24 is formed inside the connecting hole 22, and also, second wiring patterns 25 are formed inside the grooves 19.

In the method according to the related art described above, the grooves 19 for forming the second wiring patterns 25 are initially provided, and after this, the connecting hole 22 for forming the connecting plug 24 is provided by etching. This procedure may be performed in the reverse order.

In VLSI's of the 0.18 µm generation or later, the widths of wiring patterns will be increasingly narrowed, namely, approximately 0.22 µm by the 0.18 µm generation, and approximately 0.15 µm by the 0.13 µm generation. Further, as to electrical resistance, it is anticipated that 0.29 Ω/µm or less will be required for the 0.18 µm generation and 0.82 Ω/µm or less will be required for the 0.13 µm generation.

When aluminum is solely used for wiring, however, since the mass of aluminum is low, scattering of aluminum atoms occurs due to collisions with numerous electrons at wiring portions subjected to flows of electrical currents in high current densities. This leads to a partial breakage of the wiring pattern during uses for long time periods, and finally, results in disconnection. Accordingly, since breakage by so-called electro-migration may be caused, electrical currents having high current densities cannot be made to flow through the wiring pattern.

Further, when an aluminum-based metal which principally comprises aluminum and contains copper having a mass larger than that of aluminum in a content of, for example, approximately 0.5% is used for wiring, fine processing is difficult since the residue of poorly reactive copper is readily generated during a process of reactive ion etching. Additionally, copper is rarely dispersed at aluminum grain boundaries homogeneously and highly concentratedly, and therefore, the addition of 0.5% or more of copper is substantially impossible.

Meanwhile, by the method in which tungsten plugs are formed, even fine connecting holes can be readily filled with a wiring material. Such a method, however, requires a process for depositing aluminum-based metal to be a wiring pattern after tungsten deposited on an interlayer insulating film is removed. Accordingly, the time period of the process for forming wiring layers becomes long, the turnaround time increases, and therefore, the produced LSI's become expensive. Further, when this method is employed as an interconnecting method for LSI's of the 0.18 μm generation or later, connecting holes to be formed should have slant sidewalls in order to pack tungsten therein without formation of a blowhole since the connecting holes are approximately 0.20 μm in diameter and approximately 3 in aspect ratio. This requires larger diameters of the connecting holes, and therefore, is unsuitable for manufacturing finer LSI's.

Furthermore, the above-described LSI specifications can rarely be achieved by using an aluminum-based wiring material or by employing a method including formation of tungsten plugs. Accordingly, the wiring material should be a material having low electrical resistance and excellent electro-migration resistance, such as copper or a copper-based alloy.

Moreover, as shown in the layout diagram FIG. 3, connecting holes 5 are formed in an interlayer insulating film (not illustrated) to connect first wiring patterns as lower wiring patterns (not illustrated) with second wiring patterns 7 formed thereabove. For providing the above-mentioned second wiring patterns 7 so as to fill the connecting holes 5, the widths of the second wiring patterns 7 should be determined considering margins for arrangement deviation (hereinafter, simply referred to as "margin") relative to the connecting holes 5. In other words, the width wl of a second wiring pattern located above a connecting hole 5 should include a margin d (in FIG. 3, a margin of d/2 is provided on each side of a second wiring pattern located above a connecting hole). Such a design requires a wider inter-wiring spaces D increased by the margin of d/2, and therefore, is disadvantageous for manufacturing finer LSI's.

In the above-described Dual Damascene method, a connecting hole is formed upon a wiring groove which has been previously formed, or a connecting hole or a wiring groove is formed upon a connecting hole which has been previously formed. Due to this, in the lithography process to be performed, a resist pattern should be formed on a uneven surface. The formed resist pattern, therefore, tends to be deformed due to, for example, light reflection at uneven portions. This can be a disadvantage in manufacturing finer LSI's.

Further, this method requires two etching processes. Specifically, a groove is formed through a first etching process, a lithography process is then carried out, and a connecting hole is formed through a second etching process. In addition, the second etching process is complicated since the process is generally performed by continuously etching an etching-termination insulating film constituted with silicon nitride and an interlayer insulating film constituted with silicon oxide. Specifically, the etching conditions such as an etching gas and plasma electrical power should be altered so as to be suitable to each insulating film. Accordingly, substantially three etching processes should be carried out.

Moreover, in the Dual Damascene method according to the related art, as shown in FIG. 4A, when arrangement deviation e between a groove 19 and a resist opening 21 is generated in a process for forming the resist opening 21 in a resist film 20, a connecting hole 22 which is formed so as to transcript the resist opening 21 by subsequent etching with a mask of the resist film 20 is deviated relative to the groove 19.

In other words, as shown in FIGS. 4B and 4C, the connecting hole 22 is formed at a position deviated by e relative to the groove 19. Due to this, the space s between a connecting plug 24 formed in the connecting hole 22 and a second wiring pattern 25 (25b) on the side to which the connecting hole 22 is deviated becomes narrower than the previously designed value by the value of the arrangement deviation. To form second wiring patterns 25 (25a and 25b) with a sufficient space s, the second wiring patterns (corresponding to the grooves 19) should be formed with a space between the second wiring patterns 25 (the grooves 19), the space being enlarged by the value e of arrangement deviation. This enlargement is disadvantageous in manufacturing finer LSI's.

SUMMARY OF THE INVENTION

The present invention provides a method for making a multilayer wiring structure.

Specifically, the method comprises steps of:

providing a first insulating film so as to cover a lower-layer wiring pattern formed on a substrate;

providing a second insulating film on the first insulating film, the second insulating film having an etching rate slower than that of the first insulating film;

forming an opening in the second insulating film in a portion corresponding to a connecting hole to be formed so as to connect to the lower-layer wiring pattern;

providing a third insulating film on the opening and the second insulating film, the third insulating film having an etching rate faster than that of the second insulating film;

performing etching to form a groove, so as to expose at least the opening, in the third insulating film in a portion where an upper-layer wiring pattern is formed, and to form a connecting hole in the first insulating film through the opening to the lower-wiring pattern; and forming a connecting plug by packing a conductive material in the connecting hole, and forming the upper-layer wiring pattern by packing a conductive material in the groove.

In the above-described method for making a multilayer wiring structure, a first insulating film is provided so as to cover a lower-layer wiring pattern formed on a substrate, a second insulating film having an etching rate slower than that of the first insulating film is formed on the first insulating film, an opening is formed in the second insulating film at the portion corresponding to a connecting hole to be formed so as to connect with the lower-layer wiring pattern, and subsequently, a third insulating film having an etching rate faster than that of the second insulating film is formed on the opening and the second insulating film. Due to this construction, when a groove is etched in the third insulating film, the etching reaction is terminated at the second insulating film. As the etching reaction further progresses, the second insulating film serves as an etching mask, the first insulating film is etched at the portion under the opening formed in the second insulating film, and as a result, a connecting hole is formed in that portion. Hereupon, the groove formed in the third insulating film does not become deeper than desired since the etching rate of the second insulating film is slower than that of the first insulating film.

Accordingly, the groove and the connecting hole can be formed by two etching processes. Specifically, the second insulating film is etched in the first etching process, and the first and third insulating films, both of which may comprise the same material, are etched in the second etching process.

Each etching process can, therefore, be simple. Particularly the second etching process can be carried out without alteration of the etching conditions though two insulating film layers (the first and third insulating films) are etched in the process.

Further, since a groove or a connecting hole which can cause an uneven surface is not formed on the first insulating film, the surface of the third insulating film is also plain. Accordingly, grooves and connecting holes can be formed without being affected by unevenness, and therefore, they can be formed finely and precisely. This fineness and precision can be further improved by further smoothing the surface of the first insulating film.

DESCRIPTION OF THE PREFERRED EMBODIMENT

An example of the method according to the present invention will be illustrated in detail below as Example 1 with reference to FIGS. 5A to 5F. Example 1 is a modified Dual Damascene method for making a two-layer wiring structure.

Initially, a lower-layer wiring pattern 62 is formed on a substrate 61 on which active devices for integrated circuits (not illustrated) and an insulating layer (not illustrated) covering the active device have been formed (hereinafter, the substrate is referred to as "semiconductor substrate).

The above-mentioned lower layer wiring pattern 62 is formed, for example, as follows: A conductive layer for the lower layer wiring pattern 62 is formed by a depositing technique such as sputtering or CVD, and the conductive layer is patterned by a lithography technique and an etching technique.

Next, a first insulating film 63 is provided on the above-mentioned semiconductor substrate 61 so as to cover the above-mentioned lower-layer wiring pattern 62. Hereupon, the first insulating film 63 is provided by a CVD method, and comprises, for example, silicon oxide ($SiO_2$). Additionally, the first insulating film 63 is provided so as to have a thickness of, for example, approximately 600 nm after subjection to smoothing, such a thickness being required to achieve a sufficiently low capacitance between the lower-layer wiring pattern 62 and upper-layer wiring patterns to be formed afterwards. In other words, after the surface of the first insulating film 63 has been smoothed by a smoothing technique such as CMP, the first insulating film on the lower-layer wiring pattern 62 will have a thickness of approximately 600 nm.

Next, a second insulating film 64 is deposited on the first insulating film 63. The second insulating film 64 comprises an insulating material such as silicon nitride ($Si_3N_4$) which has an etching rate sufficiently slower than that of the first insulating film 63 in the reaction for etching the first insulating film 63, namely, the etching selectivity ratio of the material against the first insulating film 63 is high. The thickness of the second insulating film 64 is defined as, for example, approximately 20 nm, with which the exposed second insulating film can still remain after etching of the first insulating film 63. For example, when the first insulating film 63 comprising silicon oxide is etched by reactive ion etching using an etching gas such as octafluorobutane ($C_4F_8$) with which silicon oxide rather than silicon nitride is selectively etched, the etching selectivity ratio of the second insulating film 64 comprising silicon nitride against silicon oxide reaches approximately 30. Considering such a ratio, the thickness of the second insulating film 64 is determined as 20 nm.

Figure 1A:
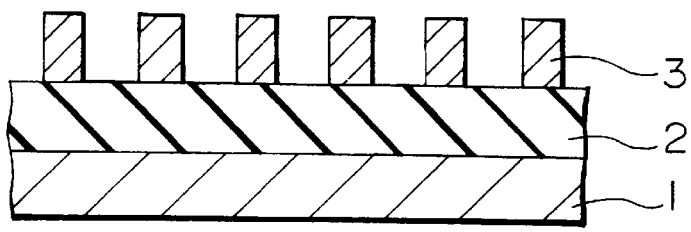
FIG. 1 consisting of FIGS. 1A through 1D contains drawings illustrating a manufacturing process for making a multilayer wiring structure in relation to a method according to a related art.
Figure 1B:
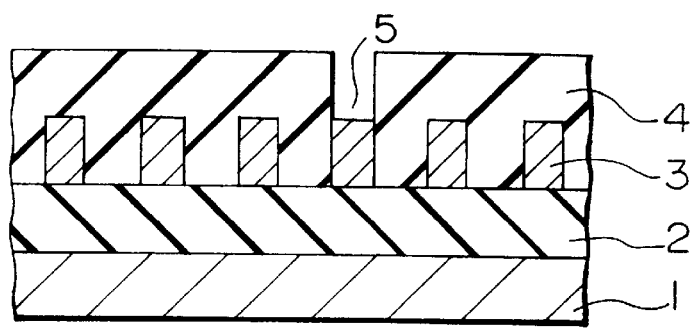
Figure 1C:
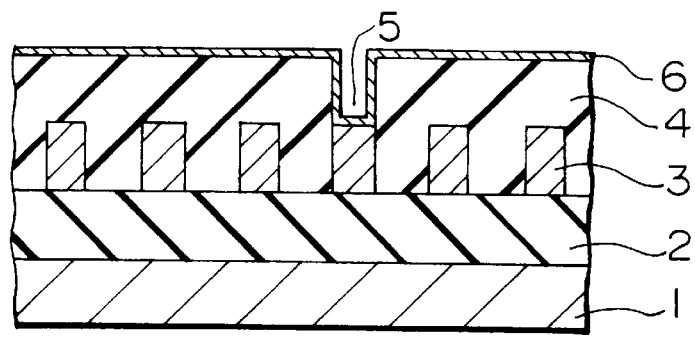
Figure 1D:
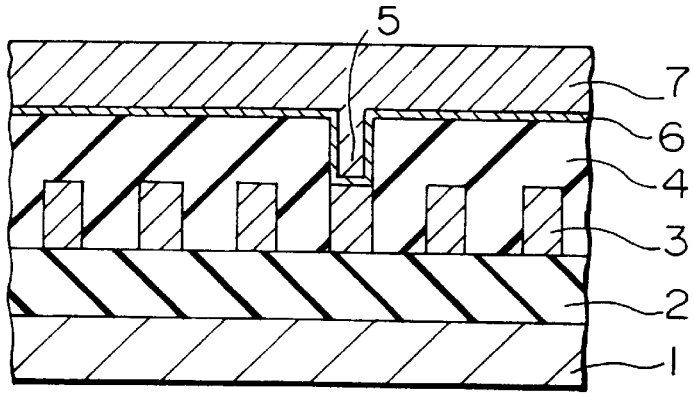
Figure 2A:
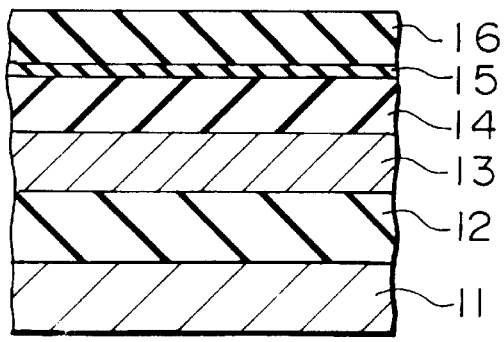
FIG. 2 consisting of FIGS. 2A through 2E contains drawings illustrating a manufacturing process for making a multilayer wiring structure by a Dual Damascene method according to a related art.
Figure 2B:
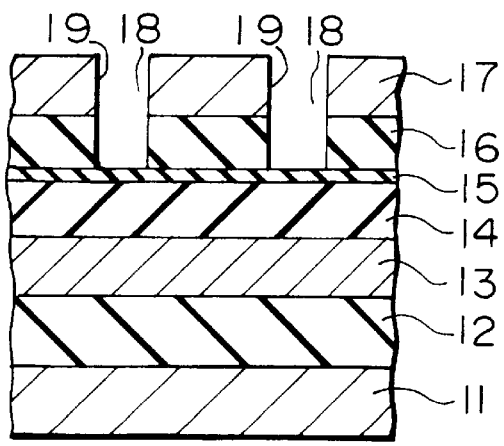
Figure 2C:
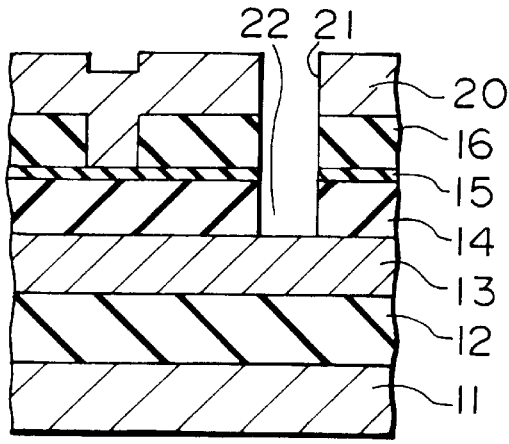
Figure 2D:
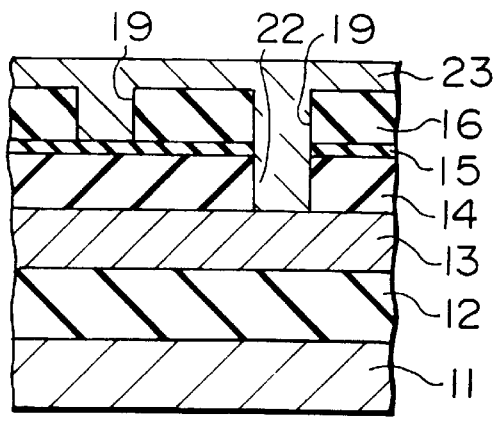
Figure 2E:
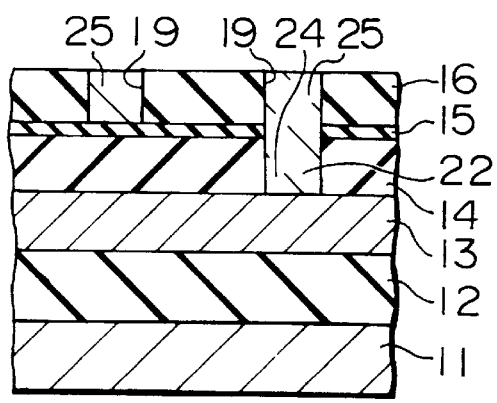
Figure 3:
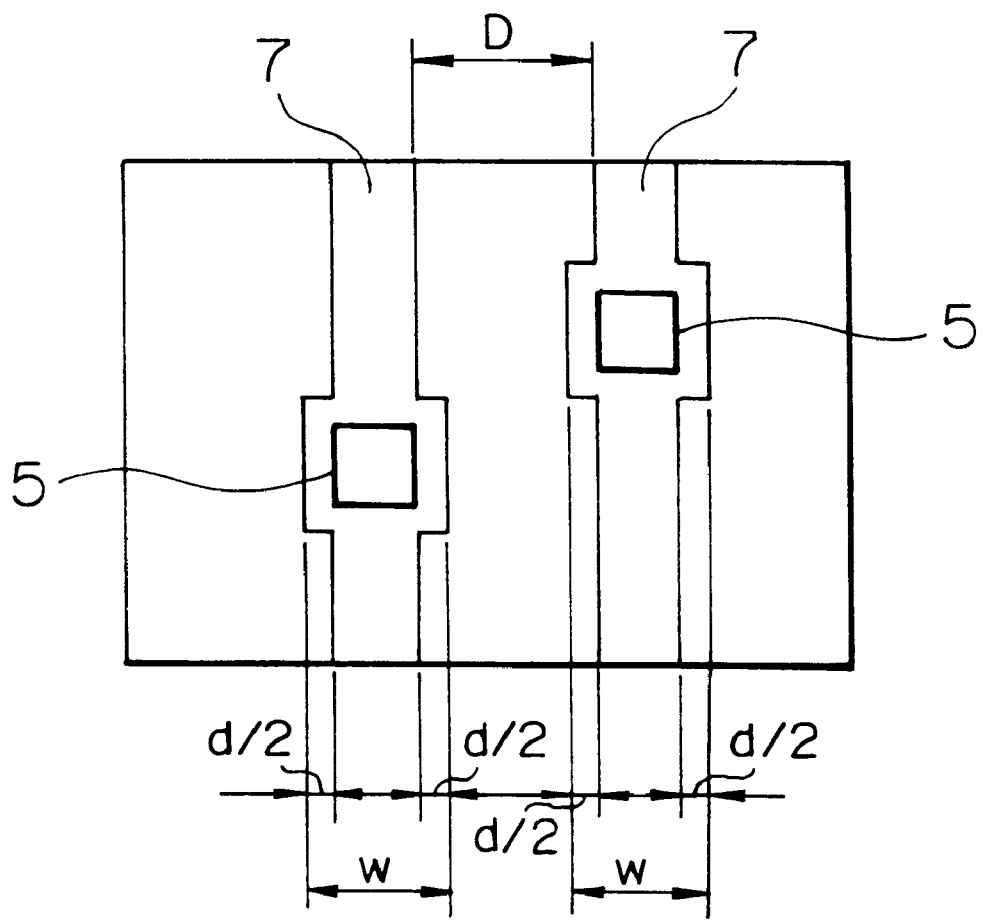
FIG. 3 is a layout diagram for illustration of a problem in a related art.
Figure 4A:
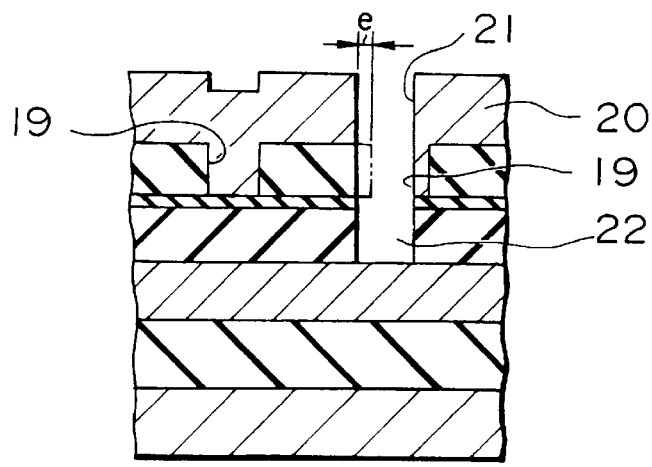
FIG. 4 consisting of FIGS. 4A through 4C contains drawings illustrating a problem in relation to a Dual Damascene method according to a related art.
Figure 4B:
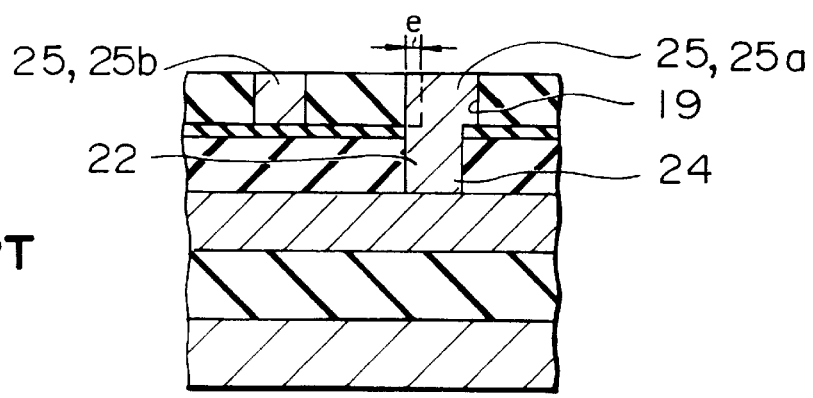
Figure 4C:
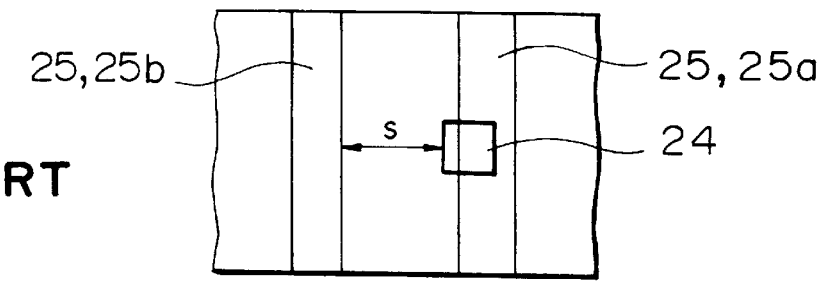
Figure 5A:
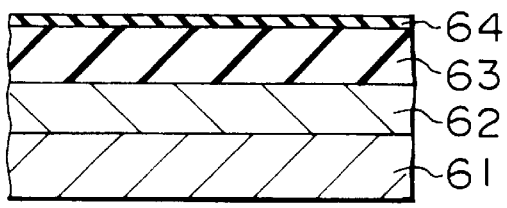
FIG. 5 consisting of FIGS. 5A through 5F contains schematic sectional drawings illustrating a manufacturing process for making a multilayer wiring structure of Example 1 according to the present invention.
Figure 5B:
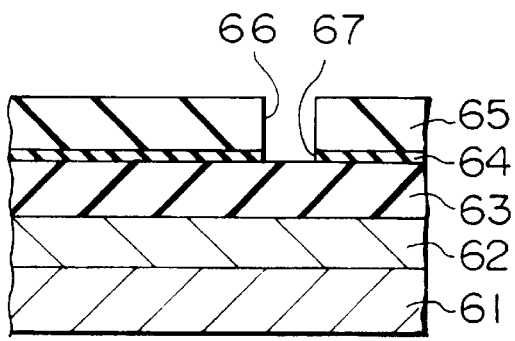

After this, as shown in FIG. 5B, a resist film 65 is provided by a coating technique, and a resist opening 66 is then formed by a lithography technique in the resist film 65 in a portion corresponding to a connecting hole to be formed for connection to the lower-layer wiring pattern 62. Next, an opening 67 is formed in the second insulating film 64 by reactive ion etching with an etching mask of the above-mentioned resist film 65. This etching process is performed, for example, using an etching gas such as trifluoromethane ($CHF_3$) which can etch silicon nitride, and a reactive ion etching apparatus (not illustrated).

Figure 5C:
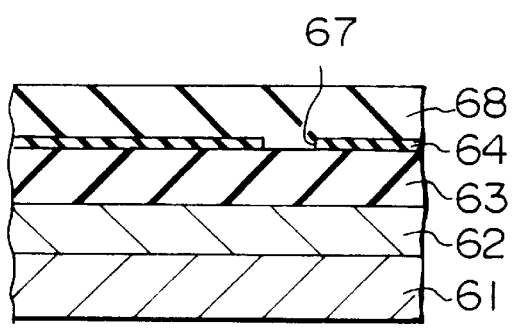

Subsequently, as shown in FIG. 5C, a third insulating film 68 having an etching rate faster than the second insulating film 64 is provided on the opening 67 and the second insulating film 64. The third insulating film 68 may comprise a material similar to that of the first insulating film 63, and is provided by deposition so as to have the necessary thickness to form grooves on which the upper-layer wiring patterns are buried, for example, approximately 600 nm.

Figure 5D:
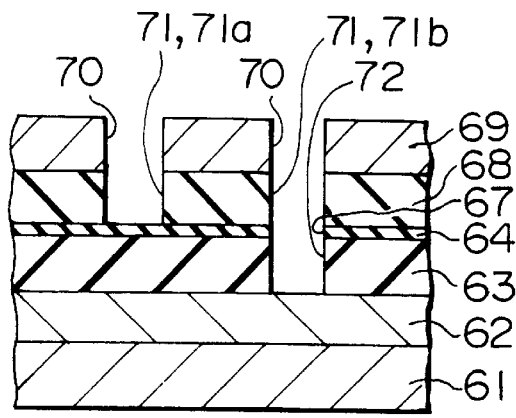

Next, as shown in FIG. 5D, a resist film 69 is provided by a coating technique, and resist openings 70 are formed by a lithography technique in the resist film 69 at portions corresponding to grooves for burying the upper-layer wiring patterns. The grooves 71 (71a and 71b) are then formed in the third insulating film 68 by reactive ion etching with an etching mask comprising the resist film 69. The groove 71b is formed on the opening 67. This etching process is performed, for example, using an etching gas such as octafluorobutane ($C_4F_8$) with which silicon oxide rather than silicon nitride can be selectively etched, and using a reactive ion etching apparatus (not illustrated).

With further progression of the etching reaction, the first insulating film 63 is etched from the opening 67, and a connecting hole 72 is formed so as to reach the lower-layer wiring pattern 62. At this time, the second insulating film 64 serves as an etching mask since the second insulating film 64 comprises silicon nitride and has a sufficiently slow etching rate as compared with the first insulating film 63. Due to this, the groove 71a formed in the second insulating film 64 do not become undesirably deep.

Figure 5E:
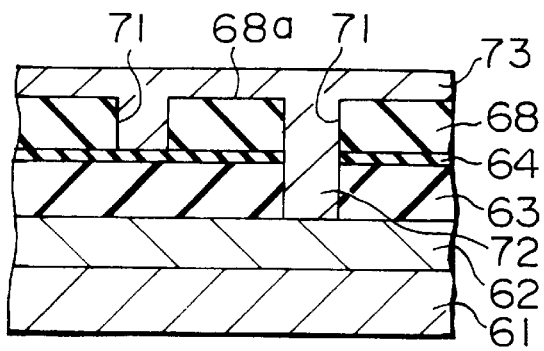

Next, as shown in FIG. 5E, a conductive material 73 is deposited by a CVD method in order to fill the connecting hole 72 and the grooves 71, and so as to cover the upper surfaces 68a of the third insulating film 68. The conductive material 73 comprises, for example, copper.

Figure 5F:
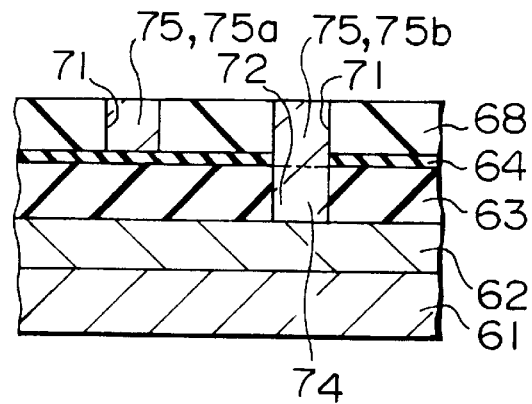

After this, the conductive material 73 in the portions other than the wiring portions, namely, the conductive material 73 on the remaining third insulating film 68, is completely removed by a smoothing technique such as CMP. As a result, as shown in FIG. 5F, a connecting plug 74 is formed inside the connecting hole 72, and the upper-layer wiring patterns 75 (75a and 75b) are formed inside the grooves 71. Since the connecting hole 72 is connected to a part of the groove 71b, a part of the upper-layer wiring pattern 75b is connected with the connecting plug 74. As a result, a multilayer wiring structure is constructed, in which the upper-layer wiring pattern 75b is connected to the lower-layer wiring pattern 62 through the connecting plug 74.

In the above-described Example 1, a two-layer wiring structure is made. For achieving a multilayer wiring structure having three or more layers, similar process illustrated above is further repeated while regarding the above-obtained upper-layer wiring patterns as secondary lower-layer wiring patterns.

Incidentally, the above-mentioned conductive material 73 is not limited to copper deposited by a CVD method. Several materials other than copper, such as copper alloys or other metal materials can be used so long as they have low electrical resistance and high electro-migration resistance. Also, the deposition method is not limited to a CVD method so long as it has excellent burying characteristics.

Further, although the first insulating film 63 and the third insulating film 68 comprise silicon oxide and the second insulating film 64 comprises silicon nitride in Example 1 described above, materials for the insulating films are not limited to this combination so long as they have excellent insulation abilities, and a formed insulating film can have an etching rate sufficiently different to other films. For example, organic SOG's (dielectric constant $\epsilon=3.0$ to 3.5), polyimide compounds (dielectric constant $\epsilon=3.0$ to 3.5), benzocyclobutene (dielectric constant $\epsilon=$approximately 2.6), and poly-para-xylylene (dielectric constant $\epsilon=$approximately 2.4) can be listed as materials containing carbon atoms and having low dielectric constants. These materials have low dielectric constants since densities and polarizabilities of the molecules are reduced by containing carbon atoms, i.e. alkyl groups. Additionally, these materials not only have low dielectric constants but also have heat resistances suitable for materials of semiconductor units. Polyimide compounds exhibit heat resistance by having imide linkages, and benzocyclobutene and poly-para-xylylene by having polymer structures of benzene rings.

Furthermore, deposition methods for obtaining the above-described films are not limited to the above-mentioned methods. They can suitably be selected from several deposition methods such as CVD, sputtering, vapor deposition, and coating.

As described above, in the method of Example 1 for making a multilayer wiring structure, a first insulating film 63 is provided so as to cover a lower-layer wiring pattern 62 formed on a semiconductor substrate 61, a second insulating film 64 having an etching rate slower than that of the first insulating film 63 is provided thereon, and an opening 67 is formed in the second insulating film 64 in a portion corresponding to a connecting hole to be formed so as to lead the lower-layer wiring pattern 62. After this, a third insulating film 68 having an etching rate faster than that of the second insulating film 64 is provided on the opening 67 and the second insulating film 64. Due to this construction, the third insulating film 68 as well as the first insulating film 63 can be selectively etched relative to the second insulating film 64.

Accordingly, when grooves 71 are formed in the third insulating film 68 by etching, the reaction to deepen the grooves 71 is terminated with the second insulating film 64. When the etching reaction further progresses, the second insulating film 64 serves as an etching mask. As a result, the first insulating film 63 is etched at the portion under the opening 67 formed in the second insulating film 64 to form a connecting hole 72. At this time, since the etching rate of the second insulating film 64 is slower than that of the first insulating film 63, the groove 71a formed in the third insulating film 68 do not become undesirably deep.

Due to this mechanism, the grooves 71 and the connecting hole 72 can be formed by two etching processes. Hereupon, the second insulating film 64 is etched in the first etching process, and the first insulating film 63 and the third insulating film 68 comprising the same material are etched in the second etching process. Each etching process can, therefore, be simply carried out. Particularly the second etching process can be carried out without alteration of the etching conditions though two insulating film layers (the first insulating film 63 and the third insulating film 68) are etched in the process.

Moreover, in contrast to the second insulating film 64 which can be thin, the first insulating film is not subjected to formation of grooves or a connecting hole which can cause an uneven surface until the grooves 71 are formed. The surface of the third insulating film 68 is, therefore, smooth without large irregularities. Due to this, the lithography process to form the grooves 71 and the connecting hole 72 can be carried out substantially without being affected by unevenness of the underlying surface, and accordingly, the grooves 71 and the connecting hole 72 can be patterned with high precision.

Additionally, as illustrated in the above Example 1, when the surface of the first insulating film 63 is smoothed, the third insulating film 68 to be formed can have a substantially smooth surface even if an opening 67 is formed in the second insulating film 64 since the second insulating film 64 is thin (for example, 20 nm in thickness). Due to this, the grooves 71 and the connecting hole 72 can be patterned with higher precision.

More specifically, such highly precise patterning can be achieved since the resist film 69 for forming the grooves 71 and the connecting hole 72 is provided on the smooth third insulating film 68, and deformation of the resist pattern due to light reflection caused by uneven portions of the underlying layer is substantially avoided when the resist film 69 is subjected to light exposure. Accordingly, since the resist openings 70 in the resist film 69 can be formed highly precisely and finely, the grooves 71 and the connecting hole 72 which are formed by transcribing the resist openings 70 can also be formed highly precisely and finely (for example, in dimensions suitable for LSI's of the 0.18 µm generation).

Further, the first insulating film 63 and the third insulating film 68 are provided so as to have thicknesses corresponding to the heights of the connecting plug 74 and the upper-layer wiring patterns 75, respectively. In other words, the heights of the upper-layer wiring patterns 75 and the connecting plug 74 are determined depending on the thicknesses of the third insulating film 68 and the first insulating film 63, respectively. Accordingly, the upper-layer wiring patterns 75 and the connecting plug 74 can be formed with high precision and an excellent reproducibility. Such precision is further improved particularly in a case where the surface of the first insulating film 63 is smoothed.

Moreover, since the grooves 71 and the connecting hole 72 are formed by etching using the same etching mask, i.e. the resist film 69 having the resist openings 70, the space between mutually adjacent grooves, i.e. the space between the upper-layer wiring patterns, is determined depending on the shape of the etching mask without being affected by formation of the connecting hole 72.

Next, Example 2 as another example of the method according to the present invention will be illustrated. In this example, although a multilayer wiring structure similar to that in Example 1 is constructed, the connecting hole 72 is formed from the third insulating film 68 to the first insulating film 63 through the opening 67 after the groove 71a has been formed. Specifically, after the groove 71a is formed and the resist film 69 for achieving the groove 71a is removed, a resist film is newly formed and an opening corresponding to the groove 71b to be connected to the connecting hole 72 is formed in the resist film. Subsequently, the third insulating film 68 and the first insulating film 63 are etched.

Next, Example 3 as another example of the method according to the present invention will be illustrated below with reference to FIGS. 6 and 7A to 7C. In this example, the same multilayer wiring structure as in Example 1 above is constructed except that the connecting hole 72 is formed with consideration to margins for arrangement deviation between the groove 71 (71b) and the connecting hole 72.

Figure 6:
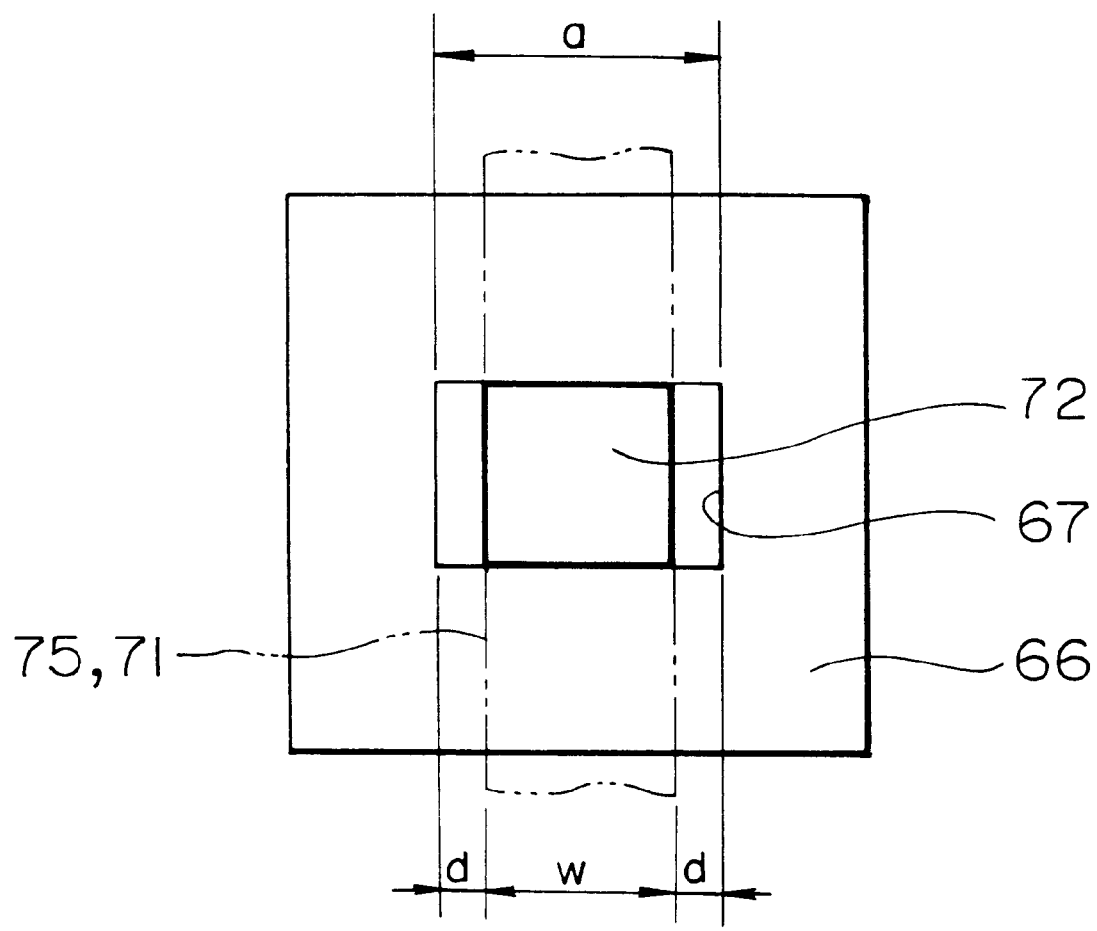
FIG. 6 is a drawing illustrating a process for forming an opening while securing margins for arrangement deviation.

As shown in FIG. 6, when an opening 67 as illustrated with the above-referred FIG. 5B is formed in a second insulating film 66, the width a of the opening 67 in the direction perpendicular to the wiring direction of an upper-layer wiring pattern 75 to be formed (shown with solid-double-dotted lines) is determined as follows.

Considering the degree of mask-arrangement deviation generated in lithography (ordinarily, approximately 0.1 to 0.2 µm), the opening 67 should be designed so as to satisfy the relationship w+2d<a. Herein, d represents a margin for arrangement deviation relative to the designed position of the connecting hole 72 (d>the degree of arrangement deviation), and w represents the width of the upper-layer wiring pattern 75 substantially equal to the width of the groove 71 in which the upper-layer wiring pattern 75 is formed.

For example, for a 0.35 µm rule, the acceptable range for the width a of the opening 67 in the direction perpendicular to the wiring direction of the upper-layer wiring pattern is calculated as satisfying 0.65<a provided that w=0.35 µm and d=0.15 µm. Accordingly, it is enough that the opening 67 has a width 0.15 µm for each side wider than the designed width for the groove 71.

On the other hand, margins in the wiring direction of the upper-layer wiring pattern need not be considered. The width of the opening 67 in the wiring direction of the upper-layer wiring pattern may be the same as the designed width of the connecting hole 72.

Incidentally, when the second insulating film 64 undergoes side etching in etching for forming the opening 67, the margin d is determined by subtracting the etched amount due to side etching.

Figure 7A:
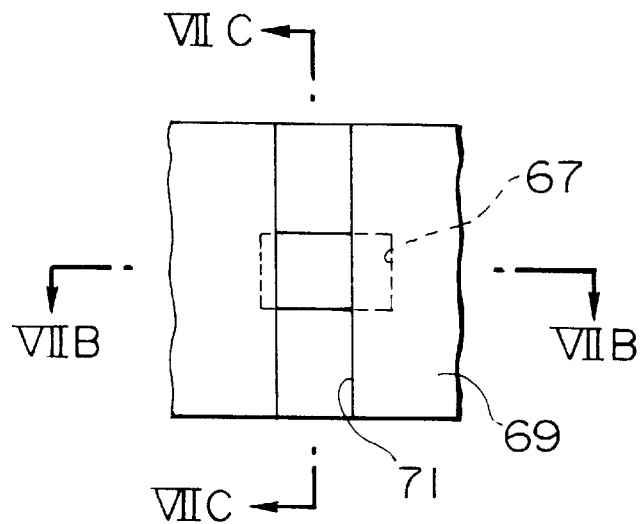
FIG. 7 consisting of FIGS. 7A through 7C contains drawings illustrating a process for forming a connecting hole in consideration of margins for arrangement deviation.
Figure 7B:
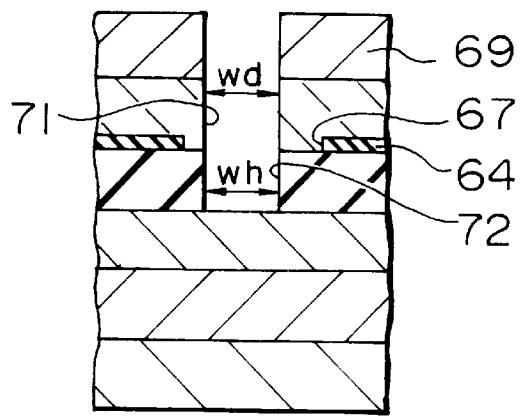
Figure 7C:
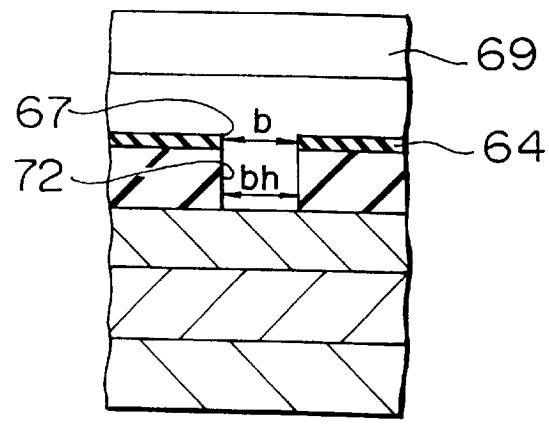

After the opening 67 is formed under the conditions described above, grooves 71 and a connecting hole 72 are formed in a manner similar to Example 1, as illustrated above with reference to FIGS. 5C and 5D. FIGS. 7A to 7C show a structure in which a groove 71 and a connecting hole 72 are formed. FIG. 7A is a layout plan view, FIG. 7B is a sectional view relative to line VII B, and FIG. 7C is a sectional view relative to line VII C.

As shown in FIGS. 7A to 7C, the opening 67 is formed in the dimensions with the addition of margins for arrangement deviation in the direction perpendicular to the groove 71 in which the upper-layer wiring pattern is formed. Due to such margins, the connecting hole 72 can be formed without obstruction by the second insulating film 64 in the direction perpendicular to the groove 71, even if arrangement deviation is generated. In addition, since the connecting hole 72 and the groove 71 in which the upper-layer wiring pattern is buried are formed by etching using the same etching mask (the resist film 69), the width wd of the groove 71 in the direction perpendicular to the wiring direction of the upper-layer wiring pattern is necessarily consistent with the width wh of the connecting hole 72 in the same direction.

On the other hand, the problem of arrangement deviation does not occur relative to the width b of the opening 67 in the direction of the groove 71, and therefore, the width b is the same as the designed width of the connecting hole 72. Accordingly, the connecting hole 72 is formed by using the second insulating film 64 as an etching mask while transcribing the opening 67 so that the width bh of the connecting hole 72 in the wiring direction of the upper-layer wiring pattern is equal to the width b.

As described above, the area for connecting the upper-layer wiring pattern 75 to the connecting plug 74 formed in the connecting hole 72 can be sufficiently secured by forming the opening 67 while considering margins for arrangement deviation.

Figure 8A:
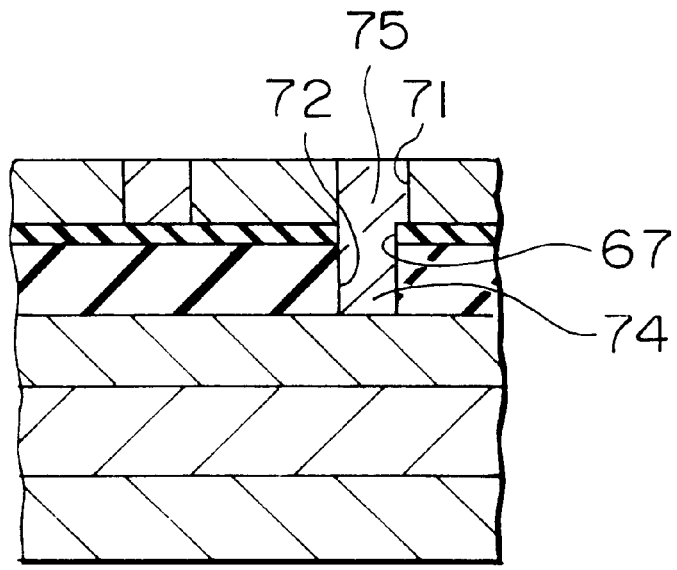
FIG. 8 consisting of FIGS. 8A through 8B contains drawings illustrating a process for forming a connecting hole without consideration of margins for arrangement deviation.
Figure 8B:
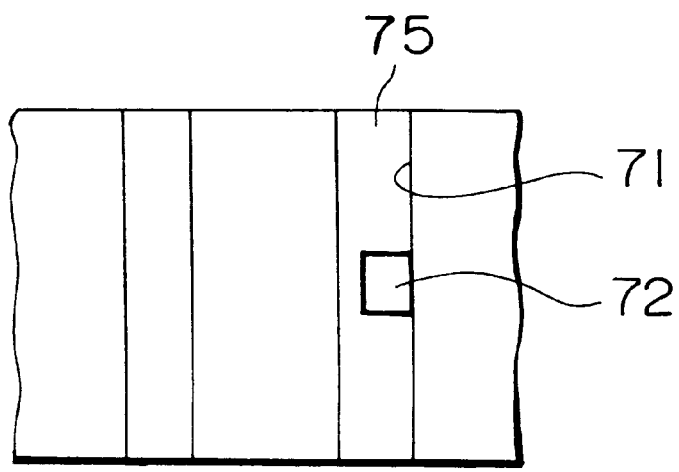

Incidentally, when the opening 67 is formed without consideration for arrangement deviation, the connecting hole 72 may be formed with deviation relative to the groove 71, as shown in FIGS. 8A and 8B. Due to such deviation, the area for connecting the upper-layer wiring pattern 75 formed in the groove 71 to the connecting plug 74 formed in the connecting hole 72 is smaller than the designed value by the amount of deviation.

As a result, problems such as signal delay and decrease in driving current occur since the contact resistance is increased due to decrease in the connecting area for the connecting plug 74 and the upper-layer wiring pattern 75.

By forming the opening 67 while considering margins for arrangement deviation as described above, the connecting area can be sufficiently secured, and therefore, problems such as signal delay and decrease in driving current can also be solved.

Figure 9:
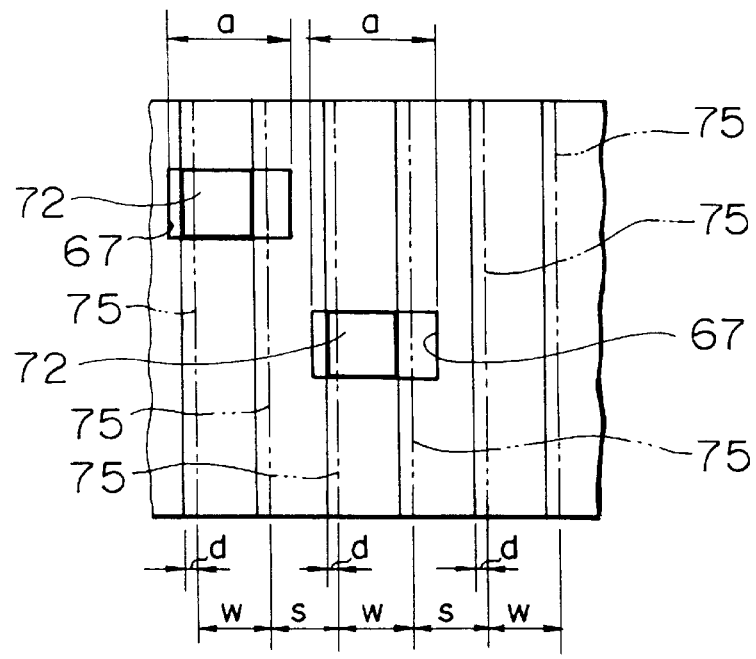
FIG. 9 is a drawing illustrating an example layout of openings.

Next, Example 4 as another example of the method according to the present invention will be illustrated below. In Example 4, upper-layer wiring patterns 75 are designed to be disposed in parallel with predetermined spaces s, as shown in FIG. 9. In such a case, the width a of openings 67 should be determined with consideration to the spaces s between the upper-layer wiring patterns 75.

In other words, the width a of openings 67 should be determined so that an opening 67 does not extend through mutually adjacent upper-layer wiring patterns 75. To achieve this, the width a should be determined so as to satisfy the relationship w+2d<a<w+2s−2d. Herein, d represents a margin for arrangement deviation relative to the designed position of each upper-layer wiring pattern 75 including a connecting hole 72 (d>the degree of arrangement deviation), and w represents the width of each upper-layer wiring pattern 75 substantially equal to the width of the corresponding groove 71 in which the upper-layer wiring pattern 75 is formed. Incidentally, portions indicated with solid-double-dotted lines are the designed positions for the upper-layer wiring patterns 75.

Accordingly, the width a of the openings 67 should be wider than the designed width of the grooves 71 by a margin for each side larger than (w+2d)/s and smaller than (w+2s−2d)/s.

For example, for a 0.35 $\mu$m rule, the width a of the openings 67 is calculated as satisfying 0.65<a<0.75 provided that w=0.35 $\mu$m, s=0.35 $\mu$m, and d=0.15 $\mu$m. Accordingly, the width of the openings 67 should be wider than the designed width of the grooves 71 by a margin for each side larger than 0.15 $\mu$m and smaller than 0.2 $\mu$m.

Figure 10:
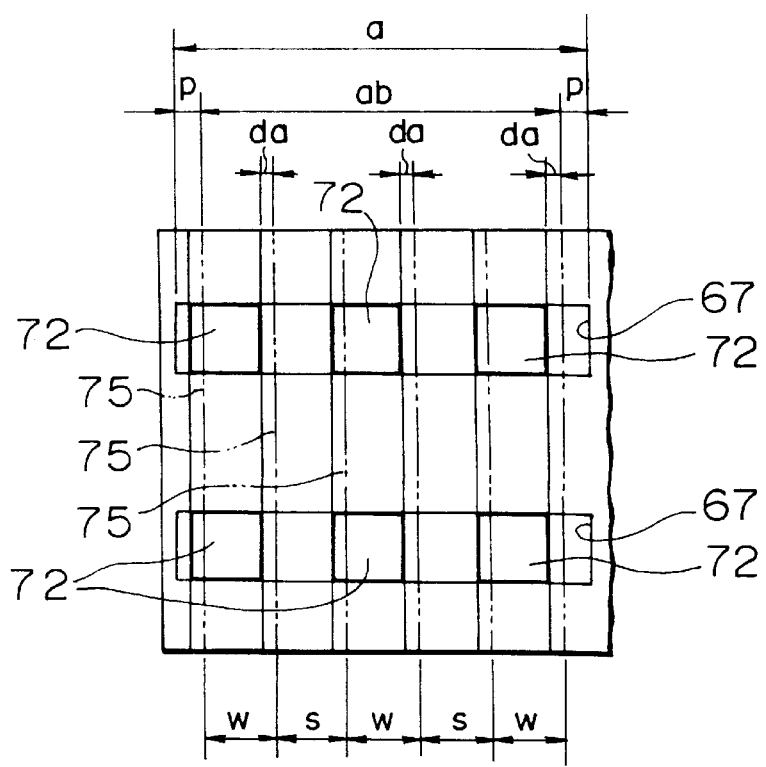
FIG. 10 is a drawing illustrating an example layout of openings.

Next, Example 5 as another example of the method according to the present invention will be illustrated below. In Example 5, upper-layer wiring patterns 75 are designed to be disposed parallel with predetermined spaces s, and connecting holes 72 are designed to be formed in lines perpendicular to the wiring direction of the upper-layer wiring patterns 75, as shown in FIG. 10. In such a case, the width a of openings 67 should include margins p for arrangement deviation so as to satisfy the relationship da<p<s−da in relation to the width ab designed without consideration to arrangement deviation (the width ab is determined according to the distance between the outer sidewalls of the most outer two upper-layer wiring patterns 75 under which the openings 67 are formed). Herein, the designed positions for the upper-layer wiring patterns 75 are indicated with solid-double-dotted lines, and da represents the maximum deviation between the designed positions and the positions of practically-formed upper-layer wiring patterns 75 (indicated with solid lines).

Accordingly, the width a of the openings 67 should be wider than the designed width ab by a margin for each side larger than da/2 and smaller than (s−da)/2.

Further, in the above-described case, the openings 67 may be formed so as to continuously extend through mutually adjacent upper-layer wiring patterns 75, as shown in FIG. 10.

Additionally, the sectional shape of the connecting holes is not limited to a square as illustrated in FIG. 10. It may be a rectangle, a circle, an ellipse, or the like.

Next, Example 6 as another example of the method according to the present invention will be illustrated below with reference to FIGS. 11A to 11D. This example is a method using, as insulating films located between wiring layers, so-called dielectric films comprising, for example, a silicon oxide compound containing fluorine [hereinafter, referred to as silicon fluoroxide (SiOF)].

Incidentally, the same reference numerals as in Example 1 are used for components similar to those illustrated in Example 1.

Figure 11A:
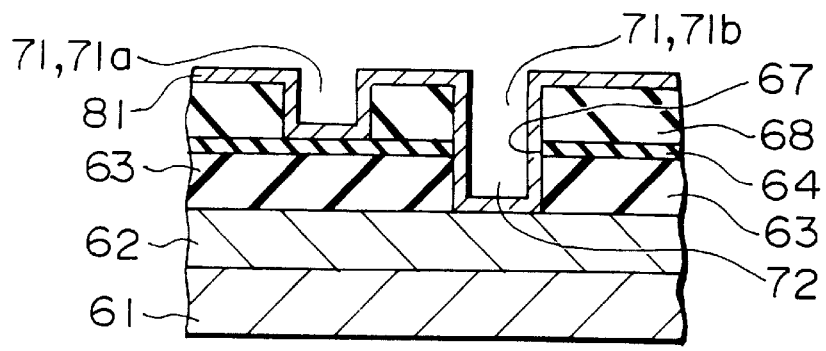
FIG. 11 consisting of FIGS. 11A through 11D contains schematic sectional drawings illustrating a manufacturing process for making a multilayer wiring structure of Example 6 according to the present invention.

Initially, as shown in FIG. 11A, according to the same manner as illustrated above with reference to FIG. 5, a lower-layer wiring pattern 62 is formed on a semiconductor substrate 61, and a first insulating film 63 is provided on the semiconductor substrate 61 so as to cover the lower-layer wiring pattern 62 by using silicon fluoroxide (SiOF). After this, the surface of the first insulating film 63 is smoothed by a smoothing technique such as CMP. Hereupon, the first insulating film 63 is provided so as to have a thickness of, for example, approximately 600 nm after subjection to smoothing, such a thickness being required to achieve a sufficiently low capacitance between the lower-layer wiring pattern 62 and upper-layer wiring patterns to be formed afterwards.

Next, a second insulating film 64 is deposited on the first insulating film 63. The second insulating film 64 comprises an insulating material such as silicon nitride ($Si_3N_4$) which has an etching rate sufficiently slower than that of the first insulating film 63, and is formed so as to have a thickness of, for example, approximately 20 nm, with which the second insulating film can still remain after a connecting hole is etched in the first insulating film 63.

After this, an opening 67 is formed in the second insulating film 64 by a technique such as coating, lithography, or etching.

Subsequently, a third insulating film 68 having an etching rate sufficiently faster than the second insulating film 64 is provided on the opening 67 and the second insulating film 64. The third insulating film 68 may be a film similar to the first insulating film 63, for example, a low-dielectric film comprising silicon fluoroxide or the like, and is provided by deposition so as to have a thickness necessary to form grooves in which the upper-layer wiring patterns are buried, for example, approximately 600 nm.

Next, grooves 71 (71a and 71b) are formed in the third insulating film 68 by a technique such as coating, lithography, or etching. Hereupon, the groove 71b is formed so that at least a part of the groove 71b is located above the opening 67.

With further progression of the etching reaction, the first insulating film is etched from the opening 67, and a connecting hole 72 is formed so as to reach the lower-layer wiring pattern 62.

After this, a fourth insulating film 81 which does not allow penetration of wiring-pattern-corrosive substances such as fluorine (F) is provided to cover the third insulating film 68 and the inside of the grooves 71 and the connecting hole 72 by a deposition technique capable of efficiently coating uneven portions, such as a low pressure CVD method. This fourth insulating film 81 comprises, for example, silicon oxide ($SiO_2$).

Figure 11B:
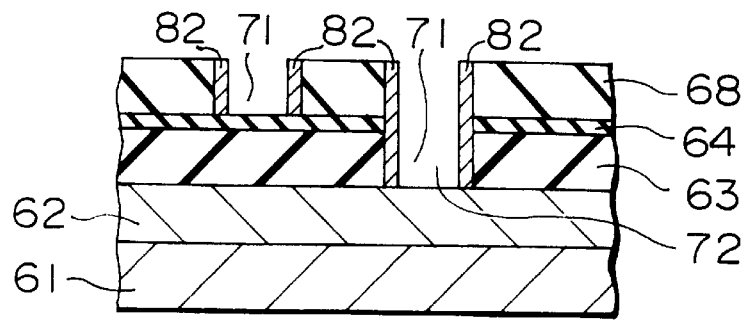

Next, by an etch back process, the fourth insulating film 81 is anisotropically etched so as to leave sidewall insulating film 82 comprising silicon oxide only on the inner sidewalls of the grooves 71 and the connecting hole 72, as shown in FIG. 11B. Any highly anisotropic etching method such as for ordinary formation of a connecting hole can be employed for this etch back process without any limitation. By this process, residue from the fourth insulating film 81 on the bottom of the groove 71a and the connecting hole 72 is also removed.

Figure 11C:
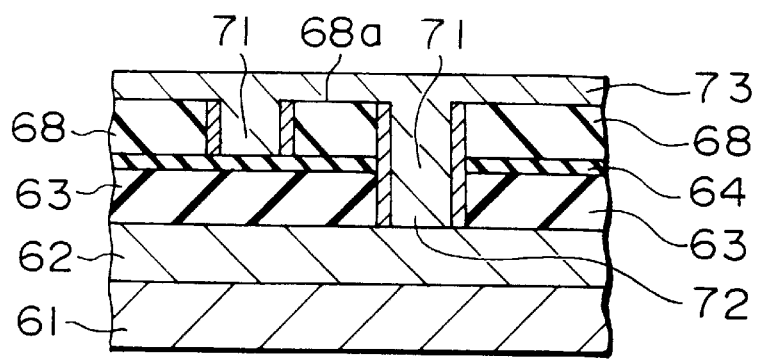

Next, as shown in FIG. 11C, a conductive material 73 is deposited by a CVD method in order to fill the connecting hole 72 and the grooves 71, and to cover the upper surfaces 68u of the third insulating film 68. The conductive material 73 comprises, for example, copper.

Figure 11D:
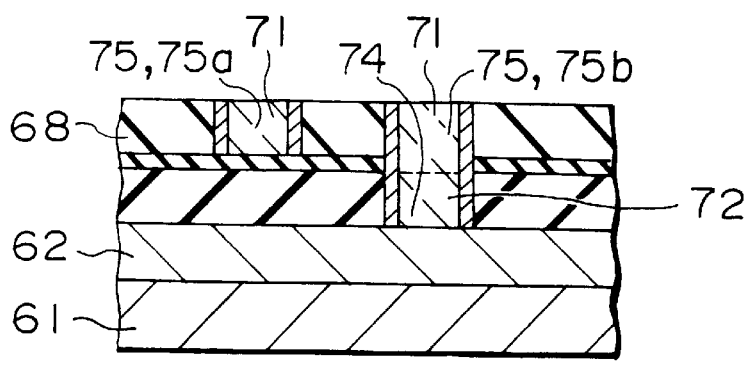

After this, the conductive material 73 in the portions other than the wiring portions, namely, the conductive material 73 on the remaining third insulating film 68, is completely removed by a smoothing technique such as CMP. As a result, as shown in FIG. 11D, a connecting plug 74 is formed inside the connecting hole 72, and the upper-layer wiring patterns 75 (75*a* and 75*b*) are formed inside the grooves 71. Since the connecting hole 72 is connected to a part of the groove 71, a part of the upper-layer wiring pattern 75*b* is connected with the connecting plug 74. As a result, a multilayer wiring structure is constructed, in which the upper-layer wiring pattern 75*b* is connected to the lower-layer wiring pattern 62 through the connecting plug 74.

Incidentally, materials for the low-dielectric films as the first insulating film 63 and the third insulating film 68 are not limited to silicon fluoroxide (dielectric constant $\epsilon$=3.2 to 3.7), or materials illustrated in Example 1 above. Other examples of such materials include fluoroplastics such as polyimide compounds with the addition of fluorine (F) (dielectric constant $\epsilon$=approximately 2.7) and polytetrafluoroethylene (dielectric constant $\epsilon$=1.9 to 2.1), and fluorine-containing organic materials such as poly allyl ether fluoride (dielectric constant $\epsilon$=2.6) and polymers having a Cytop-like structure (dielectric constant $\epsilon$=2.1). When such fluorine-containing materials are used, sidewall insulating film 82 should be formed as illustrated above in this Example 6, and the sidewall insulating film 82 should comprise an insulating material which does not allow penetration of substances such as fluorine and water which can corrode materials for the lower-layer wiring pattern 62, the connecting plug 74, and the upper-layer wiring patterns 75. Examples for such an insulating material include, in addition to silicon oxide mentioned above, silicon nitride and silicon nitroxide. As a matter of course, the insulating material is not limited to such examples so long as it can function to achieve the above-mentioned purpose.

Also in this Example 6, as illustrated in the aforementioned examples, the opening 67 is preferably formed so as to be wider in the direction perpendicular to the wiring direction of the upper-layer wiring patterns 75 while considering margins for arrangement deviation with the connecting hole 72.

According to the method of Example 6, the same effects and advantages as those in Example 1 can be achieved, and in addition, low-dielectric films, which are generally active, can be used for the first insulating film 63 and the third insulating film 68. Low-dielectric films can be used since the upper-layer wiring patterns 75 and the connecting plug 74 are separated from the first insulating film 63 and the third insulating film 68 by forming sidewall insulating film 82 on the sidewalls of the grooves 71 and the connecting hole 72.

As a result, the upper-layer wiring patterns 75 and the connecting plug 74 are not affected by substances such as fluorine (F) which may be contained in the low-dielectric films and can spoil reliability of wiring.

Incidentally, in Example 6 described above, although a protective film or the like for preventing contact between the lower-layer wiring pattern 62 and the first insulating film 63 comprising a low-dielectric film is not referred to, such a protective film can be provided, for example, by deposition of an ordinary silicon oxide film (not illustrated) after the formation of the lower-layer wiring pattern 62.

As described above, in the method according to the present invention, a multilayer wiring structure is constructed as follows: A second insulating film having an etching rate slower than that of a first insulating film is provided on the first insulating film; an opening is formed in the second insulating film in a portion corresponding to a connecting hole to be formed so as to reach a lower-wiring pattern; and after this, a third insulating film having an etching rate faster than that of the second insulating film is provided on the opening and the second insulating film. According to such a method, when grooves are etched in the third insulating film, the etching reaction can be terminated at the second insulating film; with further progression of the etching reaction, the connecting hole can be formed since the first insulating film is etched at the portion under the opening while the second insulating film serves as an etching film; and hereupon, the groove does not become undesirably deep since the etching rate of the second insulating film is slower than that of the first insulating film.

Accordingly, grooves and connecting holes can be formed by two etching processes. In particular, although two insulating films, i.e. the first and the third, are etched in the second etching process, this process can be carried out without alteration of etching conditions since the first insulating film and the third insulating film can comprise the same material. Due to this, the number of etching processes can be substantially reduced, and throughput can be improved.

Further, since grooves or connecting holes which can cause a uneven surface are not formed in the first insulating film, the surface of the third insulating film is, therefore, smooth without large irregularities. Due to this, the process to form grooves or connecting holes can be carried out substantially without being affected by unevenness of the underlying surface, and accordingly, the grooves and connecting holes can be formed with high fineness and precision. Such fineness and precision can be further improved by smoothing the surface of the first insulating film.

What is claimed is:

1. A method for making a multilayer wiring structure comprising:

providing an insulating film on a wiring pattern formed on a substrate;

forming a groove and a connecting hole in said insulating film; and packing a conductive material in said groove and said connecting hole to form an upper-layer wiring pattern, wherein said method comprises steps of:

providing a first insulating film so as to cover a lower-layer wiring pattern formed on said substrate;

providing a second insulating film on said first insulating film, said second insulating film having an etching rate different from that of said first insulating film;

forming an opening in said second insulating film in a portion corresponding to a connecting hole to be formed so as to connect to said lower-layer wiring pattern;

providing a third insulating film on said opening and said second insulating film, said third insulating film having an etching rate different from that of said second insulating film; and performing etching to form a groove, so as to expose at least said opening, in said third insulating film in a portion where an upper-layer wiring pattern is formed, and to form said connecting hole in said first insulating film through said opening to the lower-wiring pattern.

2. The method for making a multilayer wiring structure according to claim 1, wherein said second insulating film has a thickness so that said second insulating film still remains after said connecting hole is etched.

3. The method for making a multilayer wiring structure according to claim 1, wherein said method further comprises a step for smoothing the surface of said first insulating film after said first insulating film is provided so as to cover said lower-layer wiring pattern formed on said substrate, and after this, said second insulating film having an etching rate different from that of said first insulating film is provided on said first insulating film.

4. The method for making a multilayer wiring structure according to claim 2, wherein said method further comprises a step for smoothing the surface of said first insulating film after said first insulating film is provided so as to cover said lower-layer wiring pattern formed on said substrate, and after this, said second insulating film having an etching rate different from that of said first insulating film is provided on said first insulating film.

5. The method for making a multilayer wiring structure according to claim 1, wherein at least one of said first insulating film and said third insulating film comprises a material having a dielectric constant lower than that of silicon oxide; and after said connecting hole is formed from said opening to said lower-layer wiring pattern through said third insulating film and said first insulating film and said groove is formed in said third insulating film in a portion where said upper-layer wiring pattern is formed, sidewall insulating film is provided on the sidewalls of said connecting hole and said groove.

6. The method for making a multilayer wiring structure according to claim 2, wherein at least one of said first insulating film and said third insulating film comprises a material having a dielectric constant lower than that of silicon oxide; and after said connecting hole is formed from said opening to said lower-layer wiring pattern through said third insulating film and said first insulating film and said groove is formed in said third insulating film in a portion where said upper-layer wiring pattern is formed, sidewall insulating film is provided on the sidewalls of said connecting hole and said groove.

7. The method for making a multilayer wiring structure according to claim 3, wherein at least one of said first insulating film and said third insulating film comprises a material having a dielectric constant lower than that of silicon oxide; and after said connecting hole is formed from said opening to said lower-layer wiring pattern through said third insulating film and said first insulating film and said groove is formed in said third insulating film in a portion where said upper-layer wiring pattern is formed, sidewall insulating film is provided on the sidewalls of said connecting hole and said groove.

8. The method for making a multilayer wiring structure according to claim 4, wherein at least one of said first insulating film and said third insulating film comprises a material having a dielectric constant lower than that of silicon oxide; and after said connecting hole is formed from said opening to said lower-layer wiring pattern through said third insulating film and said first insulating film and said groove is formed in said third insulating film in a portion where said upper-layer wiring pattern is formed, sidewall insulating film is provided on the sidewalls of said connecting hole and said groove.

9. A method for making a multilayer wiring structure comprising:
providing an insulating film so as to cover a lower-layer wiring pattern formed on a substrate;
forming a groove and a connecting hole in said insulating film; and
packing a conductive material in said connecting hole to form a connecting plug, and packing a conductive material in said groove to form an upper-layer wiring pattern, wherein said method comprises steps of:

providing a first insulating film so as to cover a lower-layer wiring pattern formed on said substrate;
providing a second insulating film on said first insulating film, said second insulating film having an etching rate slower than that of said first insulating film;
forming an opening in said second insulating film in a portion corresponding to a connecting hole to be formed so as to connect to said lower-layer wiring pattern;
providing a third insulating film on said opening and said second insulating film, said third insulating film having an etching rate different from that of said second insulating film; and
performing etching to form a groove, so as to expose at least said opening, in said third insulating film in a portion where an upper-layer wiring pattern is formed, and to form said connecting hole in said first insulating film through said opening to the lower-wiring pattern.

10. The method for making a multilayer wiring structure according to claim 9, wherein said second insulating film has a thickness so that said second insulating film still remains after said connecting hole is etched.

11. The method for making a multilayer wiring structure according to claim 9, wherein said method further comprises a step for smoothing the surface of said first insulating film after said first insulating film is provided so as to cover said lower-layer wiring pattern formed on said substrate, and after this, said second insulating film having an etching rate slower than that of said first insulating film is provided on said first insulating film.

12. The method for making a multilayer wiring structure according to claim 10, wherein said method further comprises a step for smoothing the surface of said first insulating film after said first insulating film is provided so as to cover said lower-layer wiring pattern formed on said substrate, and after this, said second insulating film having an etching rate slower than that of said first insulating film is provided on said first insulating film.

13. A method for making a multilayer wiring structure comprising:
providing an insulating film so as to cover a lower-layer wiring pattern formed on a substrate;
forming a groove and a connecting hole in said insulating film; and
packing a conductive material in said connecting hole to form a connecting plug, and packing a conductive material in said groove to form an upper-layer wiring pattern, wherein said method comprises steps of:
providing a first insulating film so as to cover a lower-layer wiring pattern formed on said substrate;
providing a second insulating film on said first insulating film, said second insulating film having an etching rate slower than that of said first insulating film;
forming an opening in said second insulating film in a portion corresponding to a connecting hole to be formed so as to connect to said lower-layer wiring pattern;
providing a third insulating film on said opening and said second insulating film, said third insulating film having an etching rate faster than that of said second insulating film;
performing etching to form a groove, so as to expose at least said opening, in said third insulating film in a portion where an upper-layer wiring pattern is formed, and to form said connecting hole in said first insulating film through said opening to the lower-wiring pattern; and packing a conductive material in said connecting hole, and packing a conductive material in said groove.

14. The method for making a multilayer wiring structure according to claim 13, wherein said second insulating film has a thickness so that said second insulating film still remains after said connecting hole is etched.

15. The method for making a multilayer wiring structure according to claim 13, wherein said method further comprises a step for smoothing the surface of said first insulating film after said first insulating film is provided so as to cover said lower-layer wiring pattern formed on said substrate, and after this, said second insulating film having an etching rate slower than that of said first insulating film is provided on said first insulating film.

16. The method for making a multilayer wiring structure according to claim 14, wherein said method further comprises a step for smoothing the surface of said first insulating film after said first insulating film is provided so as to cover said lower-layer wiring pattern formed on said substrate, and after this, said second insulating film having an etching rate slower than that of said first insulating film is provided on said first insulating film.

* * * * *